(12) United States Patent
Chang et al.

(10) Patent No.: US 6,391,665 B1
(45) Date of Patent: May 21, 2002

(54) METHOD OF MONITORING A SOURCE CONTACT IN A FLASH MEMORY

(75) Inventors: Sang Hoan Chang; Ki Seog Kim, both of Kyungki-Do; Jin Shin, Seoul; Keun Woo Lee, Kyungki-Do, all of (KR)

(73) Assignee: Hyundai Electronics Industries Co., Ltd., Kyungki-Do (KR)

( * ) Notice: Subject to any disclaimer, the term of this patent is extended or adjusted under 35 U.S.C. 154(b) by 0 days.

(21) Appl. No.: 09/722,112

(22) Filed: Nov. 27, 2000

(30) Foreign Application Priority Data

Dec. 27, 1999 (KR) ......................................... 1999-62946

(51) Int. Cl.⁷ ............................................ H01L 21/336
(52) U.S. Cl. ......................................... 438/14; 438/257
(58) Field of Search ....................... 365/185.29, 185.28; 438/14, 15, 257

(56) References Cited

U.S. PATENT DOCUMENTS 5,535,158 A * 7/1996 Yamagata ............... 365/185.29
5,689,459 A * 11/1997 Shang-De Chang ... 365/185.28

* cited by examiner

Primary Examiner—John F. Niebling
Assistant Examiner—Andre' C. Stevenson
(74) Attorney, Agent, or Firm—Pennie & Edmonds LLP

(57) ABSTRACT

There is disclosed a method of monitoring a source contact in a flash memory by which whether a source contact having a narrow contact area contacts or not can be easily monitored using over-erase cell characteristic in a flash cell, in a flash memory device in which a source line is formed by a local interconnection method. In the present invention, in order to monitor a contact state at source contacts, the same voltage to the erase condition of a cell is applied to respective terminals (VG terminal, VD terminal, VS terminal and VSS terminal) wherein all the electrons existing at a floating gate in all the cells connected to the VS terminal and VSS terminal become turned on so that they can be over-erased. On the other hands, as electrons existing at the floating gate in two cells shared by any source contacts having a defect contact are not erased, the cells remain turn-off. In this state, if test voltages (VG=0V, VD<5V, VS=float, VSS= ground) are applied, the current flow from the VD terminal to the VSS terminal is broken in the portion having a contact defect, thus allowing the contact state of the source contacts to be monitored.

14 Claims, 2 Drawing Sheets

METHOD OF MONITORING A SOURCE CONTACT IN A FLASH MEMORY

FIELD OF THE INVENTION

The invention relates generally to a method of monitoring a source contact in a flash memory. More particularly, the present invention relates to a method of monitoring a source contact in a flash memory by which whether a source contact having a narrow contact area contacts or not can be easily monitored using over-erase cell characteristic in a flash cell, in a flash memory device in which a source line is formed by a local interconnection method.

BACKGROUND OF THE INVENTION

In general, a source line in a flash memory may be formed by diffusion line method by which impurity ions are implanted between sources of each of cells to form a diffusion line so that the source line can be formed inside a semiconductor substrate, or may be formed by applying a local interconnection method. In case that the source line is formed by local interconnection method, there are advantages that not only its effective cell size is reduced to about 86% compared to that when the diffusion line method is applied, but also a back bias effect by which the potential difference generated due to diffusion resistance is reduced from 0.1 V to 0.01 V can be reduced to 1/10, since the source contact formed per sixteen (16) cells needs not to be formed. However, as the flash memory device having the source line formed by the local interconnection method has a narrow source contact area in each of cells, there is a possibility that it may cause contact defects.

FIG. 1A is a plan view of a cell array in a conventional flash memory to which the conventional local interconnection method is applied, FIG. 1B is a cross-sectional view of a flash memory taken along lines X–X' in FIG. 1A and FIG. 1C is a cross-sectional view of a flash memory taken along lines Y–Y' in FIG. 1A.

In the flash memory to which the conventional local interconnection method is applied, a plurality of unit cells consisted of a floating gate 13, a control gate 14, a drain 15 and a common source 16 is formed in a semiconductor substrate 11 in which an active region is defined by forming a field oxide film 12, control gates 14 in each of the unit cells are connected to form word lines, drain contacts 17 are formed in the drains 15 at each of the unit cells, respective drain contacts 17 are connected to form a bit line 170, source contacts 18 are formed at the common sources 16 in each of the unit cells and respective source contacts 18 are connected to form a common source interconnection line 180.

As can be seen from the plan view of FIG. 1A, 1024 source contacts 18 are in parallel connected. Thus, the conventional local interconnection method can increase a memory characteristic since it has a lower resistance value than that by the diffusion line method. As can be seen from FIG. 1C as viewed from the bit line 170, a contact defect may be generated since the contact area is narrow. Therefore, the contact state of the source contact 18 must be carefully monitored. This, however, could not be performed exactly with the conventional method. As can be seen from FIG. 1B, the convention method could not verify any existing defected contact of 1024 contacts, if exists. This is because, even though any voltage is applied to one end of the common source interconnection line, current will flow regardless of the defected contact since the common source interconnection line is connected.

SUMMARY OF THE INVENTION

It is therefore an object of the present invention to provide a method of monitoring a source contact in a flash memory by which whether a source contact having a narrow contact area contacts or not can be easily monitored using over-erase cell characteristic in a flash cell, in a flash memory device in which a source line is formed by a local interconnection method.

In order to accomplish the above object, a method of monitoring a source contact in a flash memory according to the present invention is characterized in that it comprises the steps of providing a flash memory device in which a source line is formed by a local interconnection method; connecting a common VG terminal to word lines, connecting a VD terminal to the first drain contact of drain contacts, making the remaining drain contacts floated, connecting a VSS terminal to the last common source contact of common source contacts connecting a VS terminal to the remaining source contacts; applying an over-erase voltage to each of the terminals so that all the cells become normally turned on; and applying a test voltage to each of the terminals so that current can flow from the VD terminal to the VSS terminal to confirm the current flow.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings.

Figure 1A:
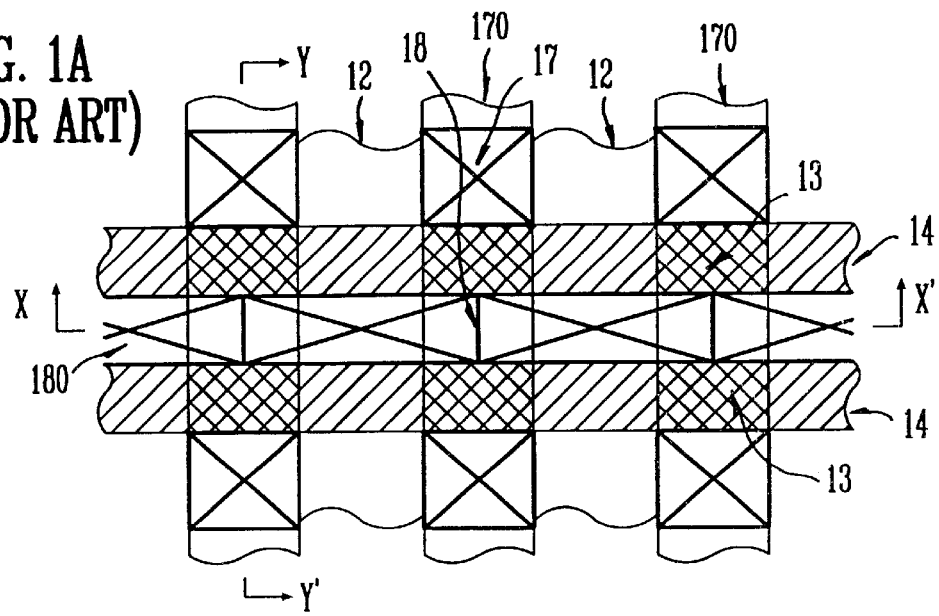
FIG. 1A is a plan view of a cell array in a conventional flash memory.
Figure 1B:
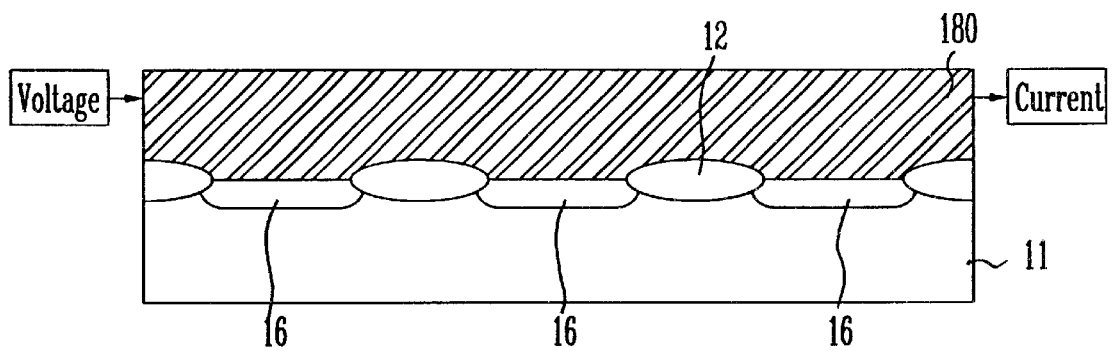
FIG. 1B is a cross-sectional view of a flash memory taken along lines X–X' in FIG. 1A.
Figure 1C:
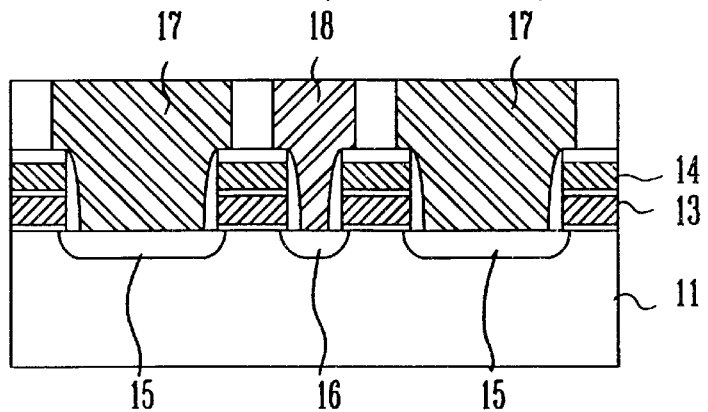
FIG. 1C is a cross-sectional view of a flash memory taken along lines Y–Y' in FIG. 1A.
Figure 2A:
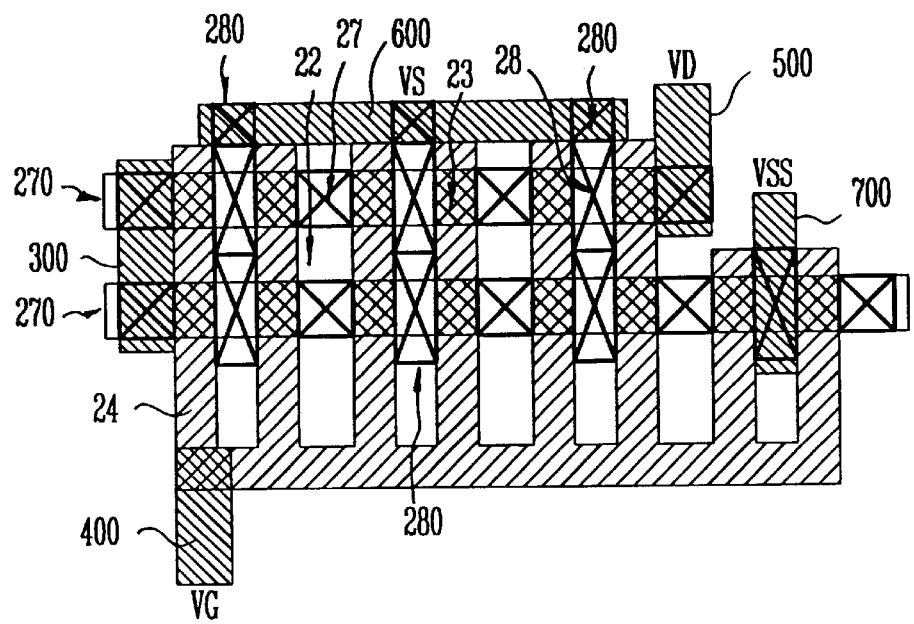
FIG. 2A is a plan view of a cell array for explaining a method of monitoring a source contact in a flash memory according to a preferred embodiment of the present invention.

FIG. 2A is a plan view of a cell array for explaining a method of monitoring a source contact in a flash memory according to a preferred embodiment of the present invention.

In the flash memory to which the local interconnection method according to the present invention is applied, a plurality of unit cells consisted of a floating gate 23, a control gate 24, a drain 25 and a common source 26 is formed in a semiconductor substrate 21 in which an active region is defined by forming a field oxide film 22, control gates 24 in each of the unit cells are connected to form word lines, drain contacts 27 are formed at the drains 25 in each of the unit cells, respective drain contacts 27 are connected to form a bit line 270, source contacts 28 are formed at the common source 26 in each of the unit cells and respective source contacts 28 are connected to form a common source interconnection line 280.

As shown in FIG. 2A, in order to monitor the source contact in the flash memory having this structure, a common VG terminal 400 is connected to the word lines 24 wherein a VD terminal 500 is connected to the first drain contact of the drain contacts 27 and the remaining drain contacts 27 are floated, and a VSS terminal 700 is connected to the last common source 20 contact of the common source contacts 28 wherein a VS terminal 600 is connected to the remaining source contacts 28. If neighboring drain contacts are separated by broken-off pattern due to space problem, these drain contacts 27 are connected by a drain contact interconnection metal wiring 300, thus allowing current to flow from the VD terminal 500 to the VSS terminal 700.

Figure 2B:
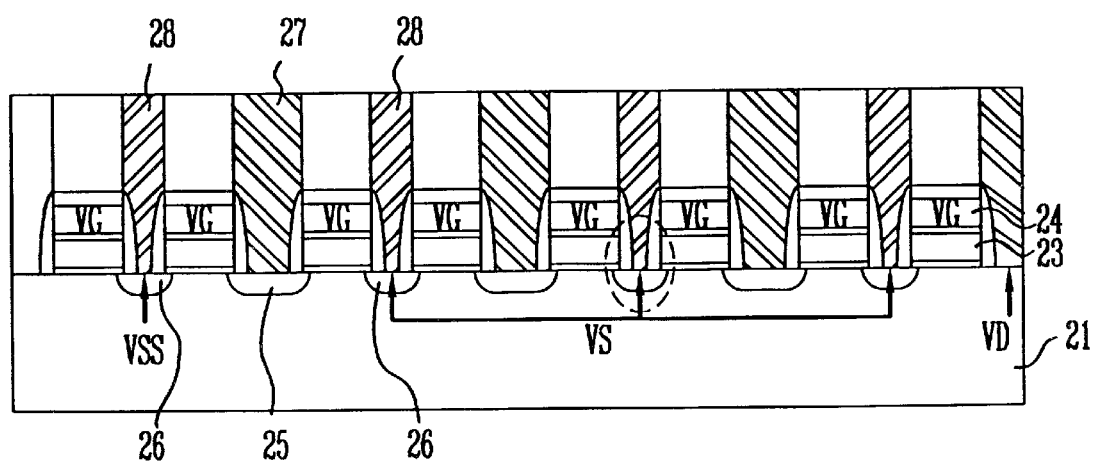
FIG. 2B shows a concept for explaining the principle of a method of monitoring a source contact according to the present invention.

FIG. 2B shows a concept for explaining the principle of a method of monitoring a source contact according to the present invention. The principle of a method of monitoring a source contact according to the present invention will be below explained by reference to the FIG. 2A.

In order to monitor the contact state at the source contacts 28, the same voltage to the erase condition of the cell is applied to respective terminals: for example, a voltage of −9 V is applied to the VG terminal 400, the VD terminal 500 is floated, a positive high voltage of 5 V is applied to the VS terminal 600 and the VSS terminal 700. At this time, the erase time is made sufficiently long so that all the electrons existing at the floating gate 23 in all the cells neighboring to the source contacts 28 each connected to the VS and VSS terminals 600 and 700 can be over-erased. Thus, all the cells are normally turned on. As indicated by the circle in FIG. 2B, if any source contact 28 having a contact defect exists, electrons existing at the floating gate 23 in the two cells shared by the source contact 28 will not be erased. Thus, the cells remain turn-off. It should be noted that the turned-off cells could not become conductive if a voltage is not applied to its gate. In this state, if a voltage of 5 V less is applied to the VD terminal 500, the VS terminal 600 is floated and a test voltage to be grounded is applied to the VSS terminal 700, the current flow from the VD terminal 500 to the VSS terminal 700 is broken in the two cells shared by the source contacts 28 having a contact defect, thus allowing the contact state of the source contacts 28 to be monitored. The voltage applied to the VD terminal 500 can be adjusted depending on the current of designed cells or the number of the cell connected thereto.

As mentioned above, the present invention can improve the throughput and reliability of a device by effectively monitoring whether any contact has made at source contacts or not and reflecting the result, in a flash memory device in which a source line is formed by a local interconnection method.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of monitoring a source contact in a flash memory, comprising the steps of:

providing a flash memory device in which a source line is formed by a local interconnection method;

connecting a common VG terminal to word lines, connecting a VD terminal to a first drain contact of a plurality of drain contacts, and making the remaining drain contacts floated, connecting a VSS terminal to a last source contact from among a plurality of source contacts, and connecting a VS terminal to the remaining source contacts;

invoking an over-erase voltage condition by applying an over-erase voltage to each of said terminals so that all the cells become normally turned on; and invoking a test condition by applying a test voltage to each of said terminals so that current can flow from said VD terminal to said VSS terminal.

2. The method according to claim 1, further including, if neighboring drain contacts are separated due to a broken-off pattern, connecting these drain contacts by a drain contact interconnection metal wiring, so that current can flow from said VD terminal to said VSS terminal.

3. The method according to claim 1, wherein said over-erase voltage condition includes applying a voltage of −9 V to said VG terminal, making said VD terminal floated and applying a positive high voltage of 5V to said VS terminal and said VSS terminal, respectively.

4. The method according to claim 1, wherein electrons existing at a floating gate in two cells shared by any source contacts having a contact defect, when said over-erase voltage is applied, are not erased to remain turned off.

5. The method according to claim 1, wherein said test condition further includes applying a voltage of 0 V to said VG terminal, applying a voltage of 5 V less to said VD terminal, making said VS terminal floated and making said VSS terminal grounded.

6. The method according to claim 1, wherein if any source contacts having a defect contact exist when said test voltage is applied, the current flow from said VD terminal to said VSS terminal is broken.

7. A method of monitoring a source contact in a flash memory device in which a source line is formed by a local interconnection method, the flash memory device having a plurality of source contacts, a plurality of drain contacts connected by bit lines, and a plurality of control gates connected by word lines, the method comprising the steps of:

connecting a common VG terminal to the word lines;

connecting a VD terminal to a first drain contact and floating the remaining drain contacts;

connecting a VSS terminal to a last source contact and connecting a VS terminal to the remaining source contacts;

invoking an over-erase voltage condition by applying a set of over-erase voltages to said terminals so that all the cells are normally turned on; and invoking a test condition by applying a set of test voltages to said terminals to determine whether current flows from the VD terminal to the VSS terminal.

8. The method according to claim 7, further comprising connecting bit lines by a drain contact interconnection metal wiring so that current can flow from the VD terminal to the VSS terminal, if neighboring drain contacts are separated due to a broken-off pattern.

9. The method according to claim 7, wherein the step of invoking the over-erase voltage condition includes applying a voltage of −9 V to the VG terminal, floating the VD terminal and applying a positive high voltage of 5 V to both the VS terminal and the VSS terminal.

10. The method according to claim 7, wherein, during the over-erase voltage condition, electrons existing at a floating gate in cells shared by a source contact having a contact defect are not erased, and those cells remain turned off.

11. The method according to claim 7, wherein the step of invoking the test condition includes applying a voltage of 0

V to said VG terminal, applying a voltage of 5 V less to the VD terminal, floating the VS terminal grounding the VSS terminal.

12. The method according to claim 7, wherein a breakage of current flow from the VD terminal to the VSS terminal during the test condition indicates the presence of a defective source contact.

13. A method of monitoring a source contact in a flash memory, comprising the steps of:
- providing a flash memory device in which a source line is formed by a local interconnection method;
- connecting a common VG terminal to word lines, connecting a VD terminal to a first drain contact of a plurality of drain contacts, and making the remaining drain contacts floated, connecting a VSS terminal to a last source contact and connecting a VS terminal to the remaining source contacts;
- if neighboring drain contacts are separated due to a broken-off pattern, connecting these drain contacts by a drain contact interconnection metal wiring, so that current can flow from said VD terminal to said VSS terminal;
- invoking an over-erase voltage condition by applying an over-erase voltage to each of said terminals so that all the cells become normally turned on; and
- invoking a test condition by applying a test voltage to each of said terminals so that current can flow from said VD terminal to said VSS terminal.

14. A method of monitoring a source contact in a flash memory device in which a source line is formed by a local interconnection method, the flash memory device having a plurality of source contacts, a plurality of drain contacts connected by bit lines, and a plurality of control gates connected by word lines, the method comprising the steps of:
- connecting a common VG terminal to the word lines;
- connecting a VD terminal to a first drain contact and floating the remaining drain contacts;
- connecting a VSS terminal to a last source contact and connecting a VS terminal to the remaining source contacts;
- connecting bit lines by a drain contact interconnection metal wiring so that current can flow from the VD terminal to the VSS terminal, if neighboring drain contacts are separated due to a broken-off pattern;
- invoking an over-erase voltage condition by applying a set of over-erase voltages to said terminals so that all cells are normally turned on; and
- invoking a test condition by applying a set of test voltages to said terminals to determine whether current flows from the VD terminal to VSS terminal.

* * * * *